United States Patent [19]

Falk et al.

[11] Patent Number: 4,866,824
[45] Date of Patent: Sep. 19, 1989

[54] CENTERING MECHANISM

[75] Inventors: Ronald J. Falk, Scotts Valley, Calif.; John S. Lee, Coon Rapids, Minn.

[73] Assignee: Micro Component Technology, Inc., St. Paul, Minn.

[21] Appl. No.: 178,842

[22] Filed: Apr. 6, 1988

Related U.S. Application Data

[63] Continuation of Ser. No. 937,838, Dec. 4, 1986, abandoned.

[51] Int. Cl.⁴ .............................................. H05K 3/00
[52] U.S. Cl. .................................... 29/33 R; 29/743; 294/2; 294/64.1; 294/119.1
[58] Field of Search ...................... 29/33 R, 33 K, 741, 29/743; 279/1 L, 3, 112; 294/2, 64.1, 119.1

[56] References Cited

U.S. PATENT DOCUMENTS

| | | | |
|---|---|---|---|
| 2,940,764 | 6/1960 | Krantz | 279/1 L |
| 4,135,630 | 1/1979 | Snyder et al. | 29/740 |
| 4,174,847 | 11/1979 | Wiesler | 279/3 |
| 4,381,601 | 5/1983 | Famai et al. | 29/743 |
| 4,429,887 | 2/1984 | Smith | 279/112 |
| 4,479,673 | 10/1984 | Inaba et al. | 294/119.1 |
| 4,527,327 | 7/1985 | Van Deuren | 29/740 |
| 4,610,473 | 9/1986 | Hawkswell | 29/743 |
| 4,611,846 | 9/1986 | Feiber et al. | 294/119.1 |

Primary Examiner—Gil Weidenfeld
Assistant Examiner—Daniel W. Howell
Attorney, Agent, or Firm—Lawrence M. Nawrocki

[57] ABSTRACT

Apparatus (10) for centering an integrated circuit device (12) along X and Y axes (95, 97) with respect to a Z axis (39). First and second jaw pairs (98, 100), are actuated so that corresponding jaws of each pair are, at all times, disposed along their respective axis at equal distances from the Z axis (39). Corresponding jaws of each pair (98, 100) are, concurrently, moved toward and away from the Z axis, therefore. In a preferred embodiment, actuation is effected by means of linear extender rods, (70, 72) which, in turn, in effect rotation of discs (26, 28) and their corresponding turnstiles (106, 114). Turnstile (106, 114) rotation, in turn, effects linear movement of track riders (84, 86) to which the jaw pairs, (98, 100) are mounted.

1 Claim, 3 Drawing Sheets

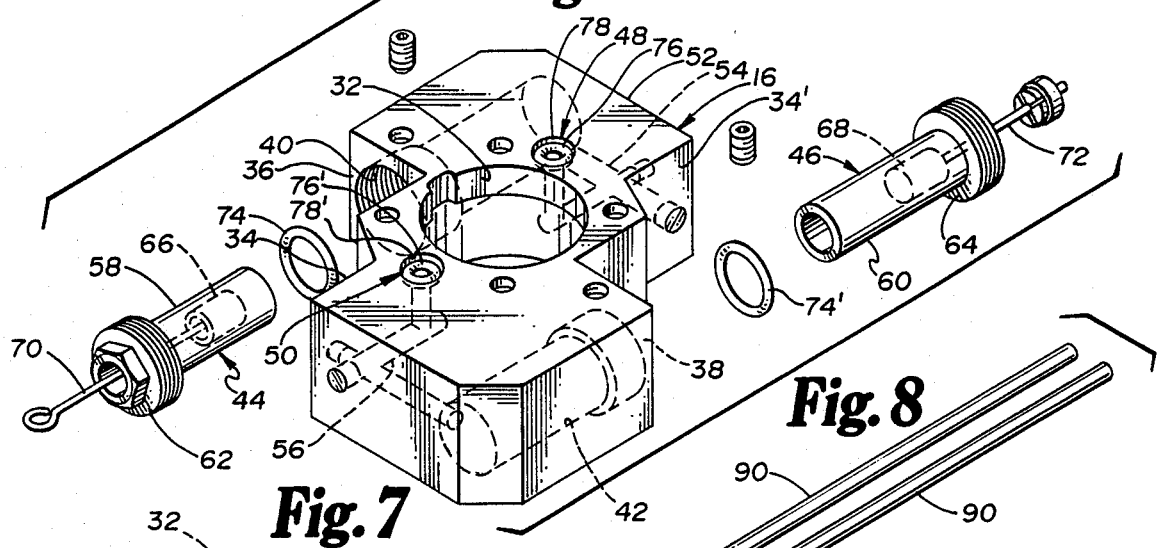
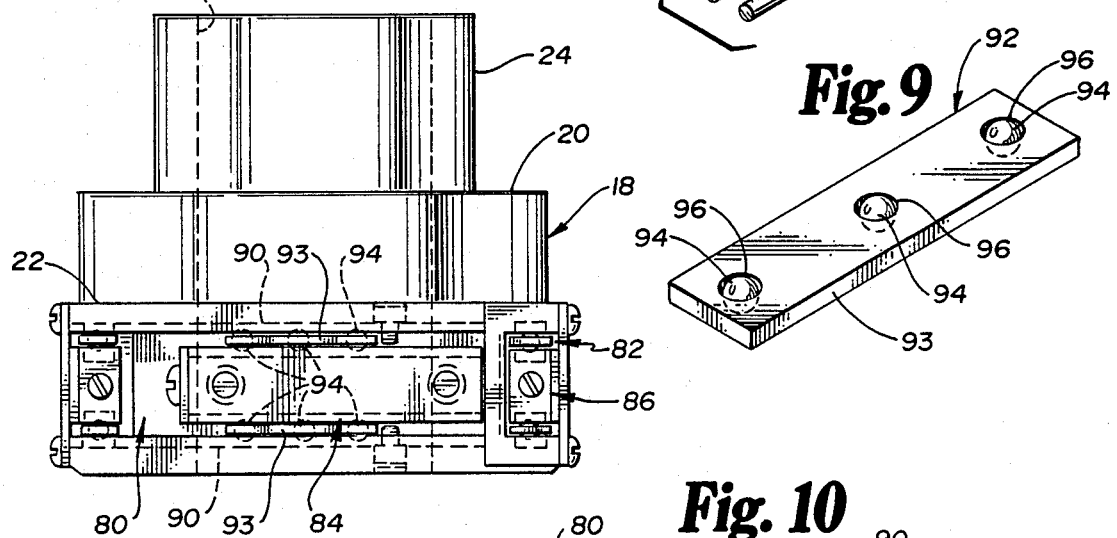
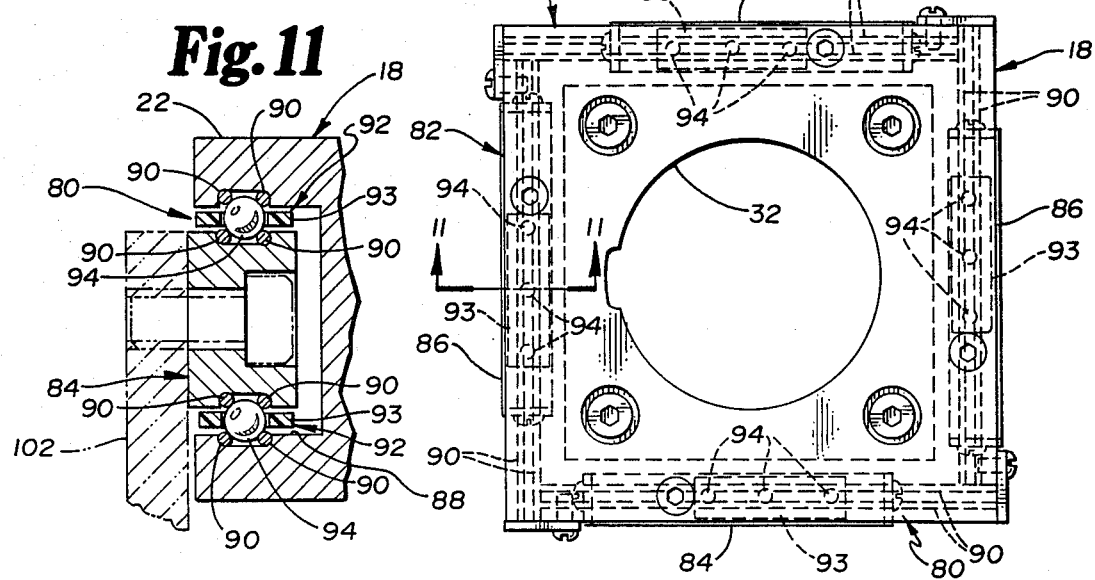

CENTERING MECHANISM

This application is a continuation of application Ser. No. 937,838, filed Dec. 4, 1986, now abandoned.

TECHNICAL FIELD

The present invention is related broadly to a technology wherein a device is to be centered, with respect to a first axis, along at least one additional axis intersecting the first axis. More specifically, the invention relates to an apparatus for centering a device such as an electronic component along mutually perpendicular X and Y axes with respect to a Z axis which intersects a plane defined by the X and Y axes. A preferred embodiment of the invention is intended to be used in the field of placing electronic components for mounting to a host structure such as a printed circuit board. The invention is, specifically, a device for centering an electronic component with respect to a pick-up head which defines a central Z axis so that, as the head is maneuvered to a known position relative to the circuit board or other host structure to which the electronic component is to be mounted, the component will be appropriately and correctly positioned for affixation.

BACKGROUND OF THE INVENTION

Electronic components of various types are used throughout the electronics industry. Such devices typically include DIPs, PLCCs, and SOICs. Such components are assembled into printed circuits by placing them at defined locations on a host structure, such as a printed circuit board, the locations depending upon the functions of the devices, the architecture of the circuits, etc.

Because many of these devices, typically, are needed to assemble a circuit board, means to handle such a multiplicity of components quickly and accurately is important. Additionally, a reliable handling mechanism is necessary because of the criticality of positional placement.

The characteristics of such electronic components require the use of precision and soft-handling instruments for use in circuit assembly. In the past, various types of devices have been employed to effect this function. One type of structure which the prior art has defined as an effective mechanism for accomplishing placement is one wherein a vacuum head "holds" the component to a placement tip by the application of a vacuum, at the tip, to the component. Such an apparatus utilizes a hollow probe such as a straw-type device for picking up and placing the component to be mounted.

Once the component has been maneuvered to a location at which it is ultimately intended to be affixed, the head can be employed to maintain the component in position during affixation or can be withdrawn after placement but before permanent affixation. The typical method of attachment involves soldering of leads of the integrated circuit or other component to counterpart connections on the host structure.

A vacuum head as previously described functions to effect soft handling and adequate retention of an electronic component prior to affixation. Other problems yet exist, however, with regard to the accurate placement of a component for circuit assembly. For example, while the placement head might be properly maneuvered to effect accurate positioning of a component being handled, a pick-up mechanism typically operates, assuming that the component being handled is centered with respect to a central longitudinal axis of the head, along two axes defining the surface to which the component is to be mounted. If the component is not properly centered, of course, the leads of the component may not engage pads on the board to which they are intended to correspond. Consequently, the assembled board of which the component becomes a part may be defective. Significant dollars and man-hours can, thereby, be wasted.

Various types of structures have been designed to alleviate this problem. For example, U.S. Pat. No. 4,135,630, which issued on Jan. 23, 1979, offers one possible solution. The device of that patent utilizes the channeling of a vacuum through a hollow spindle tip for holding the chip component after its selection from storage. A centering mechanism is employed to locate the chip centrally on the pick-and-place spindle. The X locators and Y locators comprise pairs of opposed centering arms. The centering arms are pivoted at a location axially spaced from the location at which the arms engage the electronic component being centered. The engagement portions of the arms, therefore, move through an arcuate path.

A similar structure is taught by U.S. Pat. No. 4,527,327. That patent issued on July 9, 1985 for a structure entitled DEVICE FOR TRANSFERRING AN ELECTRIC OR ELECTRONIC COMPONENT TO A MOUNTING BOARD. The device of that patent employs gripping means having two pairs of jaws for aligning and centering the component. Again, as in the '630 patent, the jaw arms are pivotally mounted and swing downwardly as they are pivoted inwardly to effect the centering function.

As will be able to be seen, as the centering arms move inwardly to effect centering, they have an apparent axial movement because of the arcuate path they follow. Consequently, the jaws could conceivably "miss" the component they were intended to center if the component has a dimension along the axis along which the jaws center the component which is sufficiently great.

The measure of arcuity of the path will, of course, be diminished the longer are the jaw arms. Space limitations would, however, dictate that some limitation be placed upon their length. As a result, the arcuity of the path of the end of the jaw arms can be relatively significant.

Another solution which the prior art has proposed is one embodied in a structure such as that illustrated in U.S. Pat. No. 4,174,847. That patent issued on Nov. 20, 1979 for a device entitled PRECISION CENTERING DEVICE. The device of that patent utilizes a pair of relatively moveable plates which form a guideway for four relatively moveable guides. A tapered centering port having a rectangular profile is formed by the guides. The guides are constrained for mutual coacting movement by the plates.

The relative positions of the moveable plates define the geometric shape of the centering port, and the relative locations of the guides determine the size of the centering port. The structure of the patent employs an adjusting member which operates a guide positioning device. As the adjusting member is turned, the plates slide along the face of an opening to adjust the size of the centering port.

While this structure does not have the drawbacks of those of the two previously discussed patents, it certainly has some shortcomings. For example, while a centering mechanism is typically limited to a maximum size in an axial direction along the axis of the pick-and-place spindle, size limits dictated also bear upon the maximum dimension radially with respect to that same axis that the device can have. The device of the '847 patent, in view of its method of functioning, would typically have a relatively significant radial dimension. That dimension might be one exceeding maximum available dimensional parameters.

It is to these problems of the prior art and the advantages that solutions to these problems would provide that the present invention is directed. It is a centering mechanism which not only is accurate, reliable, and efficient, but it is also one which enables streamlining and maximizing space utilization.

SUMMARY OF THE INVENTION

The present invention is a centering apparatus which centers a device, such as an electronic component, with respect to an axis, and along a second axis intersecting the first axis. The apparatus includes at least one pair of jaws, the jaws straddling the device to be centered. The jaw members are disposed along the second axis at equal distances from the axis with respect to which the device is to be centered. The jaws are, further, disposed for concurrent movement toward and away from the first axis so that they will always be maintained at the same distance from the axis with respect to which centering is to be effected. The jaws are disposed so that they move linearly (that is, along straight lines rather than through arcuate paths). Means are employed for actuating the jaws in their movement along such a linear path. In order to effect space conservation and to maximize accuracy of centering, such means are spaced axially from the jaw path along the axis with respect to which centering is to be effected.

With regard to a mechanism for centering an electronic component on a pick-up head prior to placement of the component on a host structure such as a printed circuit board, a central axis of elongation of the head can be defined as the Z axis. If centering is to be effected along a single axis, the axis along which centering is to be accomplished can be defined as the X axis. Typically, however, centering is effected along two mutually perpendicular axes (X and Y axes). Typically, these axes define a plane orthogonal to the Z axis.

In the preferred embodiment, a carriage block can comprise the mechanism by which the jaws are actuated. The block can include two pairs of tracks, the tracks of each pair facing oppositely from one another. The jaws can be carried by track riders, each rider riding one of the four defined tracks. Means can be provided to effect coordination of movement of the track riders within each pair. Related tracks of a pair can be disposed on opposite sides of the Z axis, and the coordinating mechanism can be such that, as one rider is moved along its corresponding track to effect movement of the jaw it carries in one direction, the related rider is moved to effect movement of its corresponding jaw in an opposite direction. In view of such coordination, as one jaw is opened, therefore, the related jaw within the pair will also be simultaneously opened.

Coordination can be effected by employing a disc to cooperate with each track rider pair. The discs are disposed, in the preferred embodiment, for rotation about the Z axis.

A first disc cooperates with the first pair of track riders, each of the riders within the pair being connected to the disc on opposite sides of the Z axis, similarly, each of the second pair of track riders is connected to the second disc on opposite sides of the Z axis. Means are provided to selectively rotate the discs. As one disc is rotated in one direction, therefore, the jaws with which it corresponds will be closed. As the direction of rotation is reversed, the jaws will be opened.

The second disc functions similarly with respect to the second pair of jaws. Rotation of the disc in one direction causes closing of the corresponding jaws, while rotation in the opposite direction accomplishes opening of the jaws.

The means for actuating the opening and closing of he jaws can, additionally, include an actuator bloc. When such a block is provided, it can house a pair of rods, each rod being disposed in a corresponding cavity in the block for selective retraction within, and extension from, its cavity. Each rod, when such structure is employed, is connected, at a distal end thereof, with a corresponding one of the discs at a location on the disc spaced radially from the Z axis. As a rod is extended from its cavity within the actuator block, therefore, rotation of its corresponding disc will be initiated in a first direction. As the rod is retracted, the disc will be rotated in the opposite direction.

The present invention is, therefore, an improved centering device which lends itself particularly for use in centering of electronic components on a pick-up head prior to the components being placed on a substrate such as a printed circuit board to effect assembly of a circuit. More specific features and advantages obtained in view of those features will become apparent with reference to the DETAILED DESCRIPTION OF THE INVENTION, appended claims, and accompanying drawing figures.

BRIEF DESCRIPTION OF THE DRAWINGS

FIG. 6 is an exploded pictorial view of the elements of the actuator block of the device;

FIG. 7 is a side elevational view of the carriage block of the device;

FIG. 8 is a pictorial view of one of the set of tracks along which a corresponding track rider rides;

FIG. 9 is a pictorial view of one of the ball bearing sets of a track;

FIG. 10 is a bottom plan view of the carriage block; and

FIG. 11 is a sectional detailed view in elevation, taken generally along line 11—11 of FIG. 10.

DETAILED DESCRIPTION OF THE PREFERRED EMBODIMENT

Figure 1:
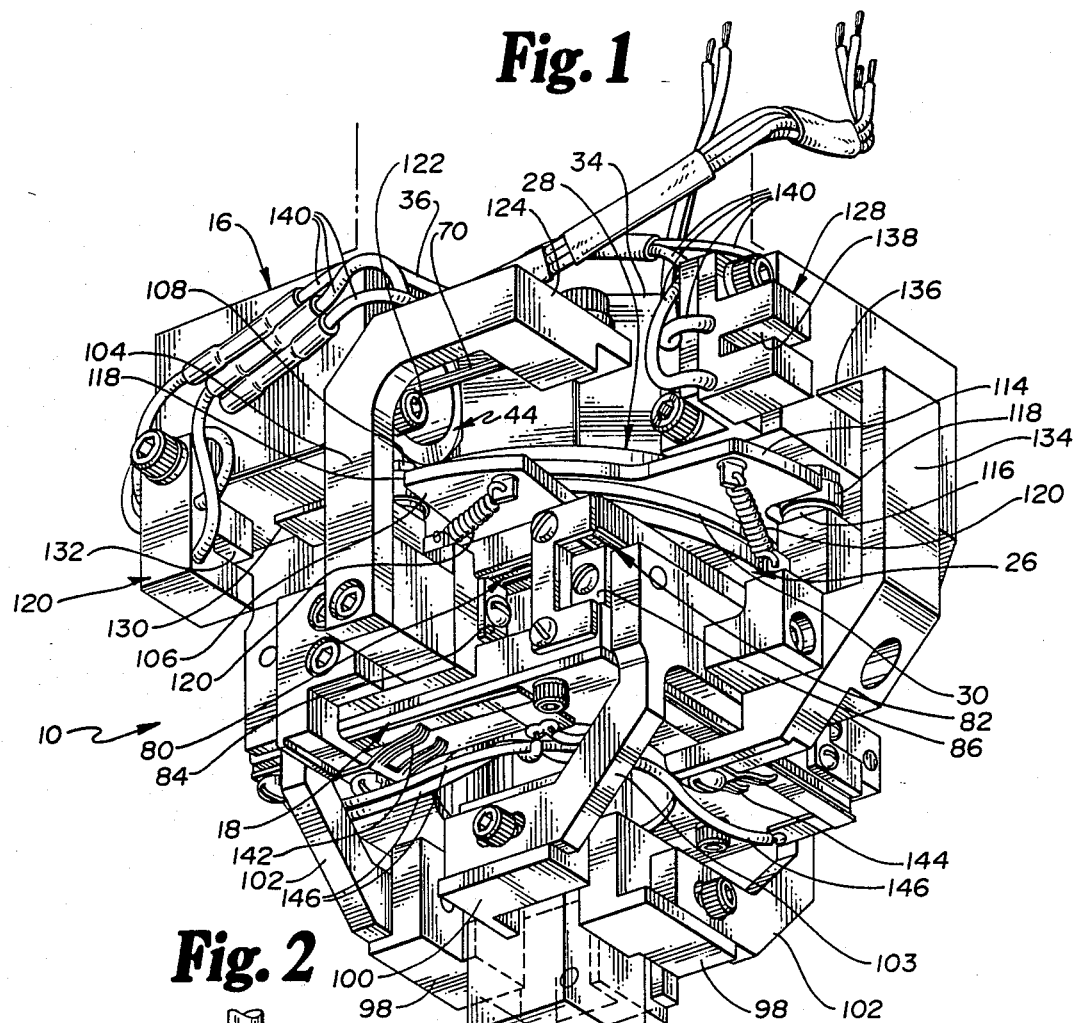
FIG. 1 is a perspective view of a centering device in accordance with the present invention seen on one diagonal and slightly below the assembly.
Figure 4:
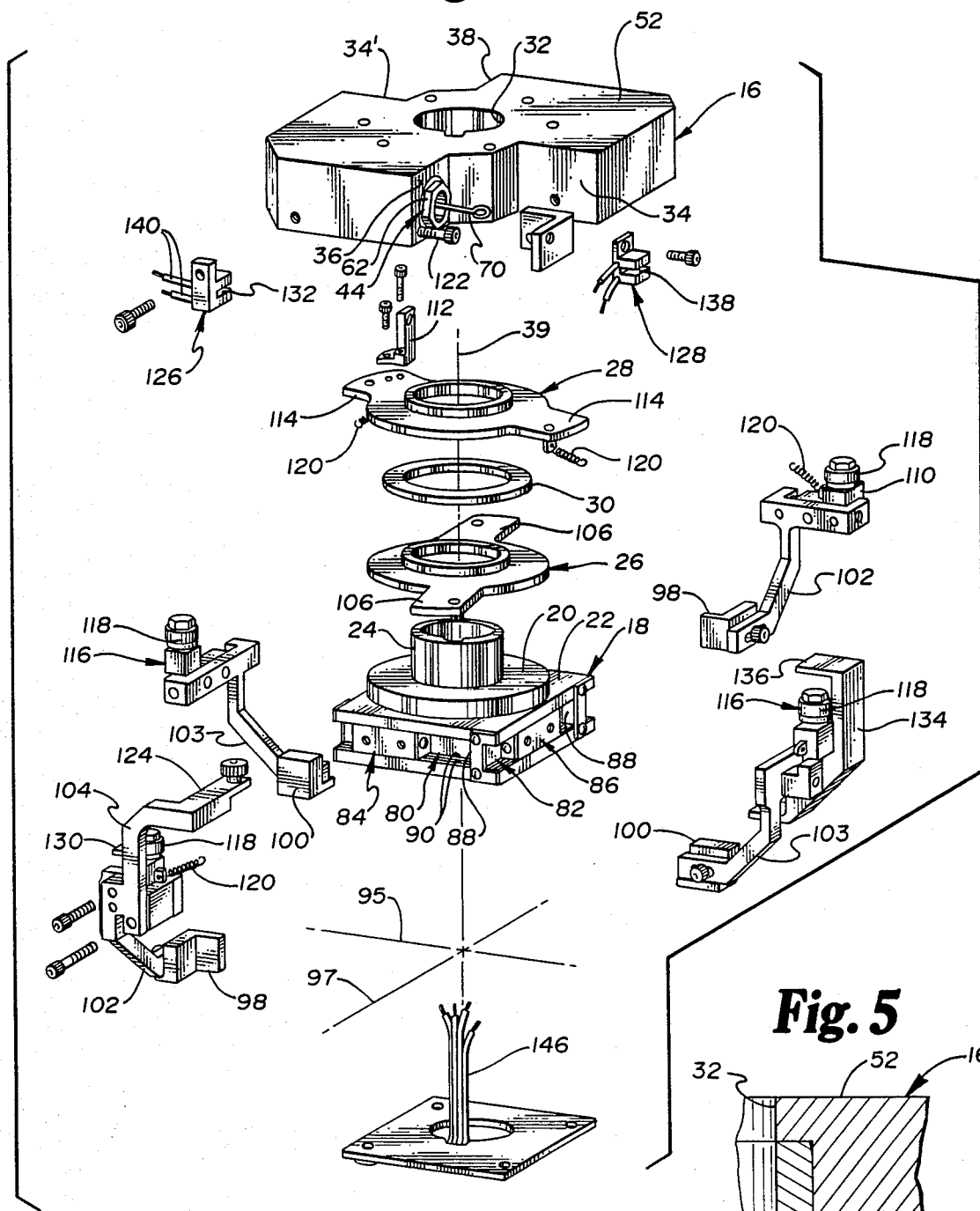
FIG. 4 is an exploded pictorial view of the device illustrated in FIG. 1.

Referring now to the drawings wherein like reference numerals denote like elements throughout the several views, FIG. 1 illustrates apparatus 10 in accordance with the present invention for centering a device 12, such as an electronic component, with respect to a pick-up head 14 which is employed for placing the component 12 on a host structure, such as a circuit board (not shown). The same apparatus 10 is illustrated in FIG. 4 in an exploded presentation. Reference will first be had, therefore, to FIG. 4.

The centering apparatus 10 includes an actuator block 16 and a carriage block 18. As seen in FIG. 4, the carriage block 18 can be provided with a step 20 on its upper surface 22. The figure illustrates that step 20 as being annular and centered with respect to the upper surface 22 of the carriage block 18.

Figure 5:
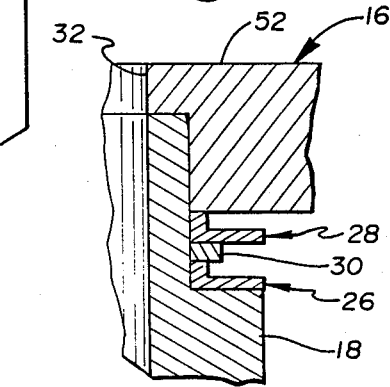
FIG. 5 is a fragmentary sectional detailed view, in enlarged scale, showing the assembled elements relative to the two discs for each axis along which centering is effected.

Coaxial with the step 20, and, again, centered with respect to the upper surface 22 of the carriage block 18, is a journal 24 for a series of discs 26, 28 and a spacer 30. When the various components 26, 28, 30 are received over the journal 24, as seen in FIG. 5, the journal 24 can be fitted into an aperture 32 which is formed centrally within the actuator block 16, and the assembly thus formed can be held together by any appropriate means.

As best seen in FIG. 6, the actuator block 16 is somewhat irregular in shape, portions of two opposite diagonal corners being cut out, as at 34, 34', to define surfaces 36, 38 which face, when the apparatus 10 is oriented with a Z axis 39 extending through the aperture 32 in the block 16, in opposite lateral directions. Each of these surfaces 36, 38 has a cavity 40, 42 formed therein to receive an extender cylinder assembly 44, 46.

Each cavity 40, 42 communicates with a corresponding port 48, 50 in the upper surface 52 of the actuator block 16 through a series of passages 54, 56. A cylinder assembly 44, 46 can be fitted into a cavity 40, 42 with an open end facing inwardly so that fluid communication can be provided between the port 48, 50 in the top 52 of the block 16 and the interior of the cylinder 58, 60. The cylinder assembly 44, 46 can be maintained within the cavity 40, 42 by providing external threads in the cylinder assembly cap 62, 64 which can be effectively mated with internal threads formed in the corresponding cavity 40, 42.

A piston 66, 68 received within the cylinder 58, 60 can be disposed for reciprocation therein. A side of the piston 66, 68 faced away from the interior of the cylinder 58, 60 can be provided with an extender rod 70, 72 which passes through the cylinder assembly cap 62, 64. The extender rod 70, 72 thereby, projects from the cavity 40, 42.

Because the mechanism anticipates fluid actuation (for example, pneumatic actuation), O-ring seals can be provided at appropriate locations. A first O-ring 74, 74' can encircle the cylinder 58, 60 and abut an inner face of the cylinder assembly cap 62, 64. Another O-ring 76, 76' can be fitted into a recess 78, 78' at the port 48, 50 in the upper surface 52 of the actuator block 16.

While the actuator block 16 is somewhat irregular in shape, the carriage block 18 of the preferred embodiment is configured generally as a square. Each edge of the carriage block mounts a track 80, 82. Each track 80, 82 is disposed so that a corresponding track rider 84, 86 can move laterally along the edge of the carriage block 18.

FIGS. 7-11 illustrate the carriage block 18 in more detail. Each track 80, 82 is shown as being recessed within its corresponding edge of the carriage block 18. Each of the upper and lower surfaces of a recess 88, as best seen in FIG. 11, have, embedded therein, a pair of rail members 90. Rail members 90, as seen in FIG. 8, can be made of round bar stock of a fine gauge, and can be made of any appropriate material.

As best seen in FIG. 11, upper and lower surfaces of track riders 84, 86 which ride in the various tracks 80, 82 can have, similarly, embedded therein corresponding rail members 90. FIG. 9 illustrates a bearing spacer 92, one of which is received between the rail members 90 embedded in the upper surface of the recess 88 defining a track 80, 82 and the corresponding rail members 90 embedded in the upper surface of the track rider 84, 86, and between the rail members 90 embedded in the lower surface of the recess 88 defining a track and the corresponding rail members 90 embedded in the lower surface of the track rider 84, 86.

The bearing spacer 92 is an elongated, platen-like structure 93. FIG. 9 illustrates a spacer carrying three ball bearings 94, each received within an aperture 96, although this number is not exclusive. Either more or less ball bearings 94 could be employed depending upon the fluidity of motion desired to be achieved between a track 80, 82 and its corresponding track rider 84, 86.

Figure 2:
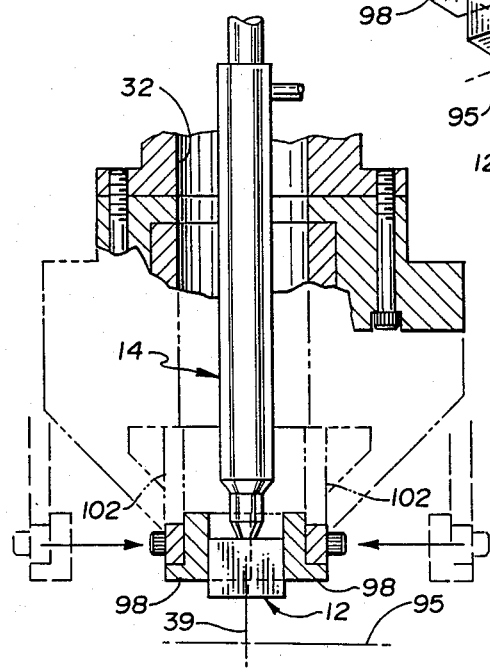
FIG. 2 is a fragmentary side elevational sectional view showing operation of one pair of jaws of the device in cooperation with a vacuum head holding an electronic component.
Figure 3:
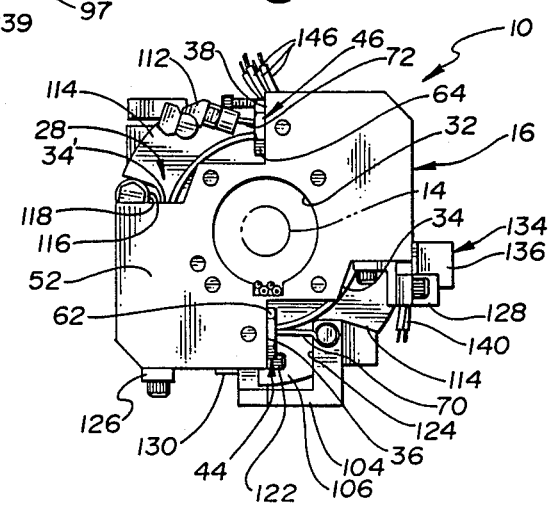
FIG. 3 is a top plan view of the device slightly reduced in scale, the vacuum head being shown in phantom.

The directions of movement of the track riders 84, 86 define mutually perpendicular X and Y axes 95, 97. It is along these axes, and with respect to the Z axis 39 along which a vacuum pick-up head 14 can be aligned (as best seen in FIG. 2), that a work piece such as an electronic component 12 to be positioned on a circuit board is centered. To effect such centering, first and second pairs of jaws 98, 100 are provided and are suspended from the track riders 84, 86 by appropriately sized and shaped linkages 102, 104 so as to position related jaws 98, 100 directly opposite one another with respect to the Z axis 39 and pick-up head 14. As will be seen hereinafter, opposite, related jaws 98, 100 are mechanically linked together to dispose them at equal distances along the X axis 95 or Y axis 97, as the case may be, from the Z axis 39.

Additionally, movement of related jaws 98, 100 (that is, two jaws employed to center along one of either the X or Y axis 95, 97) is coordinated such that, as one is moved toward the Z axis 39, the jaw related thereto will be moved a corresponding distance toward the Z axis 39. As a result, the two related jaws will be maintained, at all times, at equal distances from the Z axis 39.

Two jaw pairs are provided in the preferred embodiment. One pair centers a work piece device 12 along the X axis 95, and the other pair centers the device along the Y axis 97. Both pairs of jaws are similarly coordinated so that mutual cooperation of related jaws in both pairs is as previously described.

Coordination of movement of a pair of related jaws, in the preferred embodiment, is effected by employment of one of the discs 26, 28 discussed hereinbefore. A first, or lower, disc 26 functions to coordinate movement of a first pair of the jaws 98 along the X axis 95. In the preferred embodiment, movement of one of the jaws 98 of the first pair is substantially aligned with the movement of the first extender rod 70 which effects its actuation. Consequently, a direct linkage 104 is provided from that extender rod 70 to the track rider 84 from which that jaw 98 depends.

The related jaw 98 of the pair is disposed on the opposite side of the vacuum head 14 and the Z axis 39. The first disc 26 is provided, therefore, with a pair of turnstile-like projections 106. One of these projections 106 is engaged by an appendage 108 carried by the linkage 104 between the extender rod 70 and the track rider 84 whose jaw movement is substantially aligned with that of the extender rod 70. Consequently, extension of the first extender rod 70 from the cavity 40 in the actuator block within which it is received will effect rotation of the first disc 26 about the Z axis 39.

The other of the turnstile-like projections 106 carried by the first disc 26 effects movement of the related track rider 84 and its corresponding jaw 98. An abutment 110, associated with the track rider 84 of that jaw 98, is provided. Engagement of the abutment 110 by the turnstile-like projection 106 causes the effective, concurrent movement of the second related jaw 98 as the disc 26 is made to rotate. As will be able to be seen then, in view of this disclosure, because the jaws 98 are on opposite sides of the Z axis 39, the movement of these related jaws 98 will be reciprocal.

A second, or upper, disc 28 is provided to translate extension of the second extender rod 72 into movement of the second pair of jaws 100. Because of size and space limitations defined by the construction of the actuator block 16, however, the second extender rod 72 moves, in the preferred embodiment, generally along a path parallel to the movement path of the first extender rod 70. As will be able to be seen, this movement is generally perpendicular to the desired direction of movement of the second pair of jaws 100. Consequently, there can be no direct linkage between the extender rod 72 and either of the track riders 86 from which the jaws 100 of the second pair depend.

The second extender rod 72 must, therefore, directly effect rotation of its corresponding disc 28. This is accomplished by causing an end of the rod 72, remote from its cylinder 60, to be connected to a fitting 112 carried by the disc 28.

The disc 28, in turn, through turnstile-like projections 114 which it carries, engages abutments 116 associated with each of the corresponding track riders 86 for the jaws 100 of the second pair of effect a translation of the rotational movement of the disc 28 to the linear movement of the riders 86. Particularly with the second extender rod 72, although a similar construction can be employed with the first rod 70, the rod 72 is swivelably mounted at its ends to its cylinder 60 and the fitting 112 carried by the disc 28, so that a tendency to align the rod 72 in different orientations caused by the rotation of the disc 28 can be accommodated.

Means can be provided to minimize wear between the projections 106, 114 of the two disc 26, 28 and the abutments 108, 110, 116 carried by the track riders which might result because of friction. The abutments 108, 110, 116 can carry roller bearings 118 disposed for rotation about axes parallel to the Z axis 39. These roller bearings 118 can actually function as the abutment engagement surfaces so that, as the various discs 26, 28 rotate and the track riders 84, 86 are urged in linear motion, the roller bearings 118 will rotate to diminish the frictional effect.

Extension of the extender rods 70, 72 will, as will be able to be seen, effect a "pushing" of the abutments 110, 116 to accomplish movement of the track riders 84, 86 in a first direction. In order to insure that the riders 84, 86 will be moved in reciprocal directions upon retraction of the extender rods 70, 72, means are provided to "pull" the track riders 84, 86 back. It is envisioned that this means will take the form of a tension spring 120 mated, at one end thereof, to a turnstile-like projection 106, 114, and, at its other end, to the abutment 108, 110, 116 engaged by the projection.

Means can be provided to adjust the degree to which the jaws 98, 100 of a pair are allowed to open. A stop 122, engaged by the linkage 104 between an extender rod 70 and its corresponding track rider 84 can be provided for this purpose. The stop 122 is adjustable along an axis parallel to the axis of movement of the extender rod 70 by means of, for example, threaded insertion and retraction, and is disposed so that, as the extender rod 70 is retracted, a shoulder 124 carried by the linkage 104 will engage the stop 122. Such a stop 122 can be employed to limit both jaw pairs 98, 100.

Operation of the apparatus 10 can be facilitated by providing means for ascertaining that a jaw pair has been opened to its maximum extent. With this known, the apparatus 10 can be safely directed to a location at which a component 12 to be placed is positioned, knowing that the component 12 will be able to be received between the jaw pairs.

Light emission device (LED) arrays 126, 128 can be provided for this purpose. The linkage 104 which interconnects the first extender rod 70 and the track rider 84 to which the extender rod 70 is directly connected can carry a flag 130 which, when the extender rod 70 is retracted to completely open the jaws 98, will be received within a slit 132 in an LED 126 depending from the actuator block 16. The breaking of the optical circuit will initiate a signal representative of a condition wherein the first jaw set is completely opened.

Similarly, the jaw pair 100 which centers along the Y axis 97 can also be provided with an LED arrangement 128, also depending from the actuator block 16. An extension 134 of one of the track riders 86 for moving a jaw 100 for centering along the Y axis 97 can be formed with a flag 136 receivable within a slot 138 in that LED 128. The flag 136 would be received in the slot 138 when the Y axis 97 centering jaws 100 were retracted to their maximum opened positions. In the case of the second pair of jaws 100, as would be true in the case of the first pair of jaws 98, cabling 140 would be provided to transmit a particular response to a processor (not shown).

In operation, it would be determined, by utilization of the LEDs 126, 128, that both jaw pairs 98, 100 were completely opened. The centering apparatus 10, with a vacuum pick-up head 14 held centrally within the central aperture 32 through the actuator block/carriage block arrangement, as seen in FIG. 2, is maneuvered to a station at which a component 12 to be centered with respect to the Z axis 39 is positioned. Typically, the component 12 is oriented and positioned such that pick-up by the centering mechanism 10/vacuum pick-up head 14 assembly is facilitated.

In a preferred embodiment, the pick-up head 14 would be extended downwardly through the aperture 32 and engaged with an upper surface of the component 12. With the head 14 in this position, a vacuum is taken through the tip of the head 14 so that the component 12 will be maintained at the tip.

The centering apparatus/pick-up head assembly can, then, be maneuvered to a location at a substrate at which the component 12 is to be deposited. While maneuvering is occurring, the extender rods 70, 72 can be sequentially actuated to center the component 12 on the tip of the vacuum head 14. Typically, one of the jaw pairs is actuated first to center along either the X or the Y axis 95, 97, and the other pair is actuated thereafter.

Linear potentiometers 142, 144 can be mounted to ascertain the position of one of each pair of related jaws 98, 100 along the respective X and Y axes 95, 97. As the jaws 98, 100 have engaged a device 12 being placed and hold that device 12 therebetween, they will come to a rest position. One of each pair of track riders 84, 86 can have a potentiometer 142, 144 associated therewith. Since related jaws open and close commensurately, by ascertaining the position of one jaw of the pair along its respective axis, one can ascertain the position of the other related jaw also. By providing such potentiometers 142, 144, the apparatus 10 can, through appropriate cabling 146, transmit information to the processor. By receiving such information, the processor can determine if an intended component 12 is grasped by the jaws 98, 100 and whether that component is appropriately oriented.

The assembly is brought to a position at which the head 14 is disposed such that, if the component 12 is centered thereon, it can deposit the component 12 for affixation to the substrate to which it is to be secured. If the particular application is one wherein an electronic component is to be posited at a location on a ceramic board, for example, affixation can be accomplished by means of soldering.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for centering a device with respect to a Z axis along mutually perpendicular X and Y axes, comprising:
    (a) a first pair of jaws, straddling the device to be centered, disposed along the X axis for concurrent movement toward and away from the Z axis to define a first linear jaw path, said first pair of jaws being placed such that each is at a distance from the Z axis equal to its corresponding jaw;
    (b) a second pair of jaws, straddling the device to be centered, disposed along the Y axis for concurrent movement toward and away from the Z axis to define a second linear jaw path, said second pair of jaws being placed such that each is a distance from the Z axis equal to its corresponding jaw;
    (c) a carriage block having a first and second pairs of tracks, wherein the tracks of each pair face oppositely from one another;
    (d) a first pair of track riders, each of said first pair of riders riding a corresponding one of said first pair of tracks and carrying a corresponding first jaw;
    (e) a second pair of track riders, each of said second pair of riders riding a corresponding one of said second pair of tracks and carrying a corresponding second jaw;
    (f) first rotational means, disposed for rotation about the Z axis, associated with said first pair of track riders, each of said first pair of track riders being connected to said first rotational means on opposite sides of the Z axis;
    (g) second rotational means, disposed for rotation about the Z axis, associated with said second pair of track riders, each of said second pair of track riders being connected to said second rotational means on opposite sides of the Z axis; and
    (h) an actuator block having first and second rods, each disposed in a corresponding cavity formed in said actuator block for selective retraction therewithin and extension therefrom along an axis generally parallel to an axis along which the opposite of said rods retracts and extends, said first rod being operatively connected to said first rotational means to effect rotation thereof about the Z axis, and said second rod being operatively connected to said second rotational means to effect rotation thereof about the Z axis.

* * * * *